(12) United States Patent
Xiang et al.

(10) Patent No.: US 10,692,875 B2
(45) Date of Patent: Jun. 23, 2020

(54) MEMORY STRUCTURE

(71) Applicant: UNITED MICROELECTRONICS CORP., Hsinchu (TW)

(72) Inventors: Wang Xiang, Singapore (SG); Chia-Ching Hsu, Yunlin County (TW); Chun-Sung Huang, Yuanlin (TW); Yung-Lin Tseng, Xiushui Township (TW); Wei-Chang Liu, Singapore (SG); Shen-De Wang, Zhudong Township (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 16/177,812

(22) Filed: Nov. 1, 2018

(65) Prior Publication Data
US 2020/0119027 A1 Apr. 16, 2020

(30) Foreign Application Priority Data

Oct. 15, 2018 (CN) .......................... 2018 1 1196689

(51) Int. Cl.
| | | |
|---|---|---|
| *H01L 27/115* | (2017.01) | |
| *H01L 27/11524* | (2017.01) | |
| *H01L 27/11565* | (2017.01) | |
| *H01L 27/11519* | (2017.01) | |
| *H01L 27/1157* | (2017.01) | |

(52) U.S. Cl.
CPC .... *H01L 27/11524* (2013.01); *H01L 27/1157* (2013.01); *H01L 27/11519* (2013.01); *H01L 27/11565* (2013.01)

(58) Field of Classification Search
CPC ......... H01L 27/11524; H01L 27/11519; H01L 27/11565; H01L 27/1157; H01L 27/11548; H01L 29/42328; H01L 29/66553; H01L 29/66545; H01L 29/5329
See application file for complete search history.

(56) References Cited

U.S. PATENT DOCUMENTS

| | | | |
|---|---|---|---|
| 9,159,735 B2 | 10/2015 | Tsair et al. | |
| 9,466,732 B2 | 10/2016 | Tkachev | |
| 9,978,761 B2 | 5/2018 | Liu et al. | |
| 2008/0049517 A1* | 2/2008 | Hung ................ | H01L 27/11521 365/185.28 |
| 2013/0099301 A1* | 4/2013 | Cho .................. | H01L 27/11521 257/316 |
| 2014/0008713 A1* | 1/2014 | Toh ................... | H01L 27/11524 257/321 |
| 2015/0048439 A1 | 2/2015 | Shum et al. | |
| 2018/0145085 A1 | 5/2018 | Liu et al. | |

* cited by examiner

*Primary Examiner* — Cuong Q Nguyen
(74) *Attorney, Agent, or Firm* — J.C. Patents

(57) ABSTRACT

A memory structure including a substrate, at least one stacked gate structure, a first spacer conductive layer, and a first contact is provided. The stacked gate structure is located on the substrate and includes a control gate. The control gate extends in a first direction. The first spacer conductive layer is located on one sidewall of the control gate and is electrically insulated from the control gate. The first spacer conductive layer includes a first merged spacer portion and a first non-merged spacer portion. A line width of the first merged spacer portion is greater than a line width of the first non-merged spacer portion. The first contact is connected to the first merged spacer portion. The memory structure can have a larger process window of contact.

20 Claims, 6 Drawing Sheets

MEMORY STRUCTURE

CROSS-REFERENCE TO RELATED APPLICATION

This application claims the priority benefit of China application serial no. 201811196689.4, filed on Oct. 15, 2018. The entirety of the above-mentioned patent application is hereby incorporated by reference herein and made a part of this specification.

BACKGROUND OF THE INVENTION

Field of the Invention

The invention relates to a semiconductor structure, and particularly relates to a memory structure.

Description of Related Art

A non-volatile memory structure has been developed, which has a select gate in the form of a spacer. In addition, the subsequently formed contact will be connected to the slope of the select gate.

However, as the semiconductor device dimension continues to shrink, the process window of contact also decreases in the process for forming the contact connected to the select gate of the spacer form. Thus, it is quite difficult to accurately connect the contact to the select gate of the spacer form.

SUMMARY OF THE INVENTION

The invention provides a memory structure which can have a larger process window of contact.

The invention provides a memory structure, which includes a substrate, at least one stacked gate structure, a first spacer conductive layer, and a first contact. The stacked gate structure is located on the substrate and includes a control gate. The control gate extends in a first direction. The first spacer conductive layer is located on one sidewall of the control gate and is electrically insulated from the control gate. The first spacer conductive layer includes a first merged spacer portion and a first non-merged spacer portion. A line width of the first merged spacer portion is greater than a line width of the first non-merged spacer portion. The first contact is connected to the first merged spacer portion.

According to an embodiment of the invention, in the memory structure, the line width of the first merged spacer portion is, for example, 1.2 to 2 times the line width of the first non-merged spacer portion.

According to an embodiment of the invention, in the memory structure, the substrate may include a contact landing region.

According to an embodiment of the invention, in the memory structure, the control gate located in the contact landing region has a notch. The first merged spacer portion is located in the notch.

According to an embodiment of the invention, in the memory structure, a line width of the control gate in the contact landing region may be greater than a line width of the control gate outside the contact landing region.

According to an embodiment of the invention, the memory structure may further include active regions. The active regions extend in a second direction. The first direction intersects the second direction. The contact landing region may be located between two adjacent active regions.

According to an embodiment of the invention, in the memory structure, when the number of stacked gate structure is multiple, each of the stacked gate structures may include the control gate. Two adjacent first spacer conductive layers are disposed between two adjacent control gates. The two adjacent first spacer conductive layers may share the first merged spacer portion.

According to an embodiment of the invention, in the memory structure, a first spacing between the two adjacent control gates may be less than a second spacing between the two adjacent control gates. The first merged spacer portion may be located in a trench having the first spacing between the two adjacent control gates.

According to an embodiment of the invention, the memory structure may further include an isolation structure. The isolation structure is located in the substrate.

According to an embodiment of the invention, in the memory structure, the first merged spacer portion may be located above the isolation structure.

According to an embodiment of the invention, the memory structure may further include a second spacer conductive layer. The second spacer conductive layer is located on the other sidewall of the control gate and is electrically insulated from the control gate.

According to an embodiment of the invention, in the memory structure, the second spacer conductive layer may include a second merged spacer portion and a second non-merged spacer portion. A line width of the second merged spacer portion is greater than a line width of the second non-merged spacer portion.

According to an embodiment of the invention, in the memory structure, the line width of the second merged spacer portion is, for example, 1.2 to 2 times the line width of the second non-merged spacer portion.

According to an embodiment of the invention, in the memory structure, when the number of stacked gate structure is multiple, each of the stacked gate structures may include the control gate.

According to an embodiment of the invention, in the memory structure, two adjacent second spacer conductive layers may be disposed between two adjacent control gates.

According to an embodiment of the invention, in the memory structure, the two adjacent second spacer conductive layers may share the second merged spacer portion.

According to an embodiment of the invention, in the memory structure, a first spacing between the two adjacent control gates may be less than a second spacing between the two adjacent control gates. The second merged spacer portion may be located in a trench having the first spacing between the two adjacent control gates.

According to an embodiment of the invention, the memory structure may further include a second contact. The second contact is connected to the second merged spacer portion.

According to an embodiment of the invention, in the memory structure, the stacked gate structure may further include a charge storage layer. The charge storage layer is located between the substrate and the control gate and is electrically insulated from the substrate and the control gate.

According to an embodiment of the invention, in the memory structure, the charge storage layer is, for example, a charge trapping layer or a floating gate.

Based on the above description, in the memory structure of the invention, since the first contact is connected to the first merged spacer portion having a larger line width, the memory structure can have a larger process window of contact.

In order to make the aforementioned and other objects, features and advantages of the invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
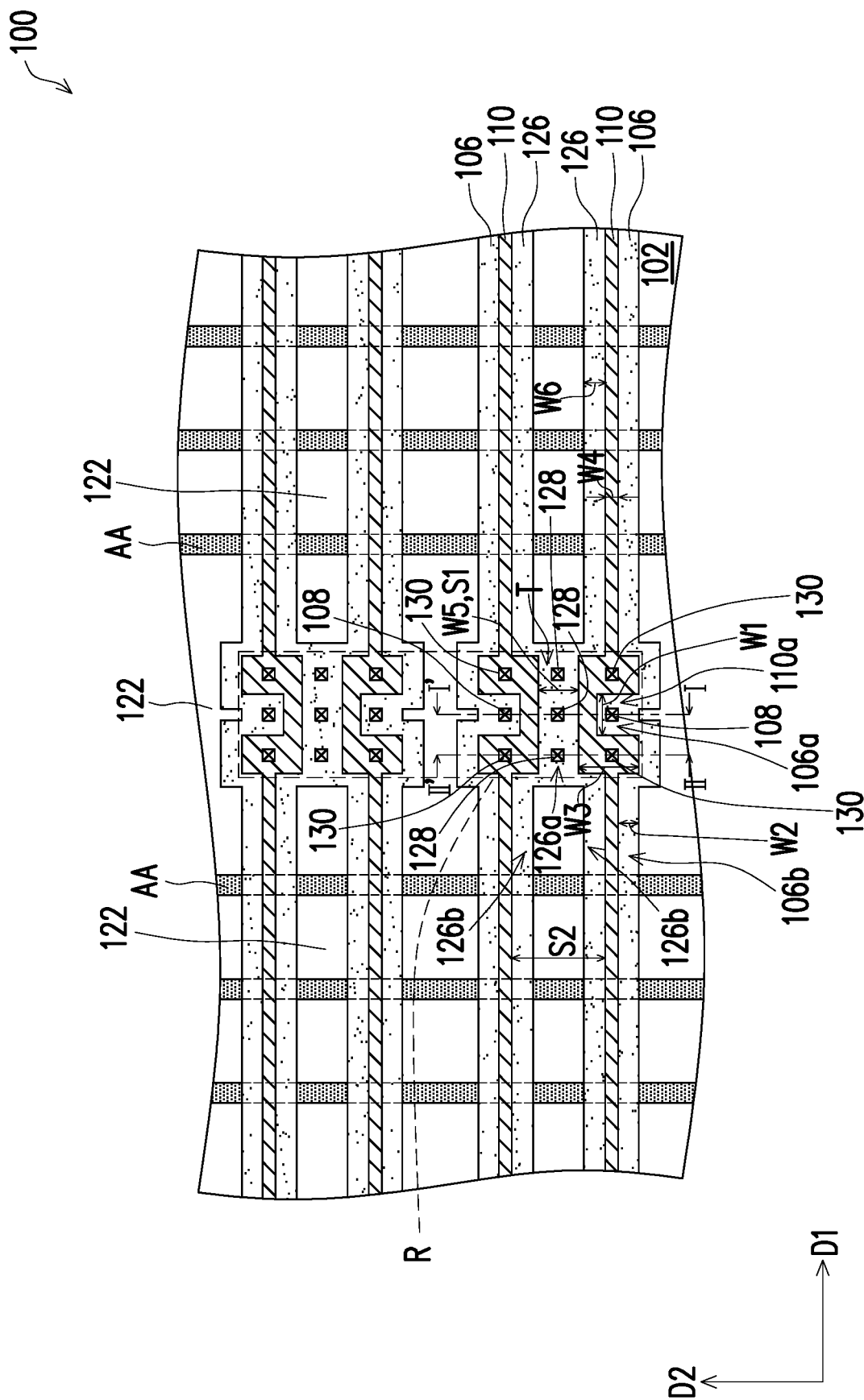
FIG. 1 is a top view of a memory structure according to an embodiment of the invention.
Figure 2A:
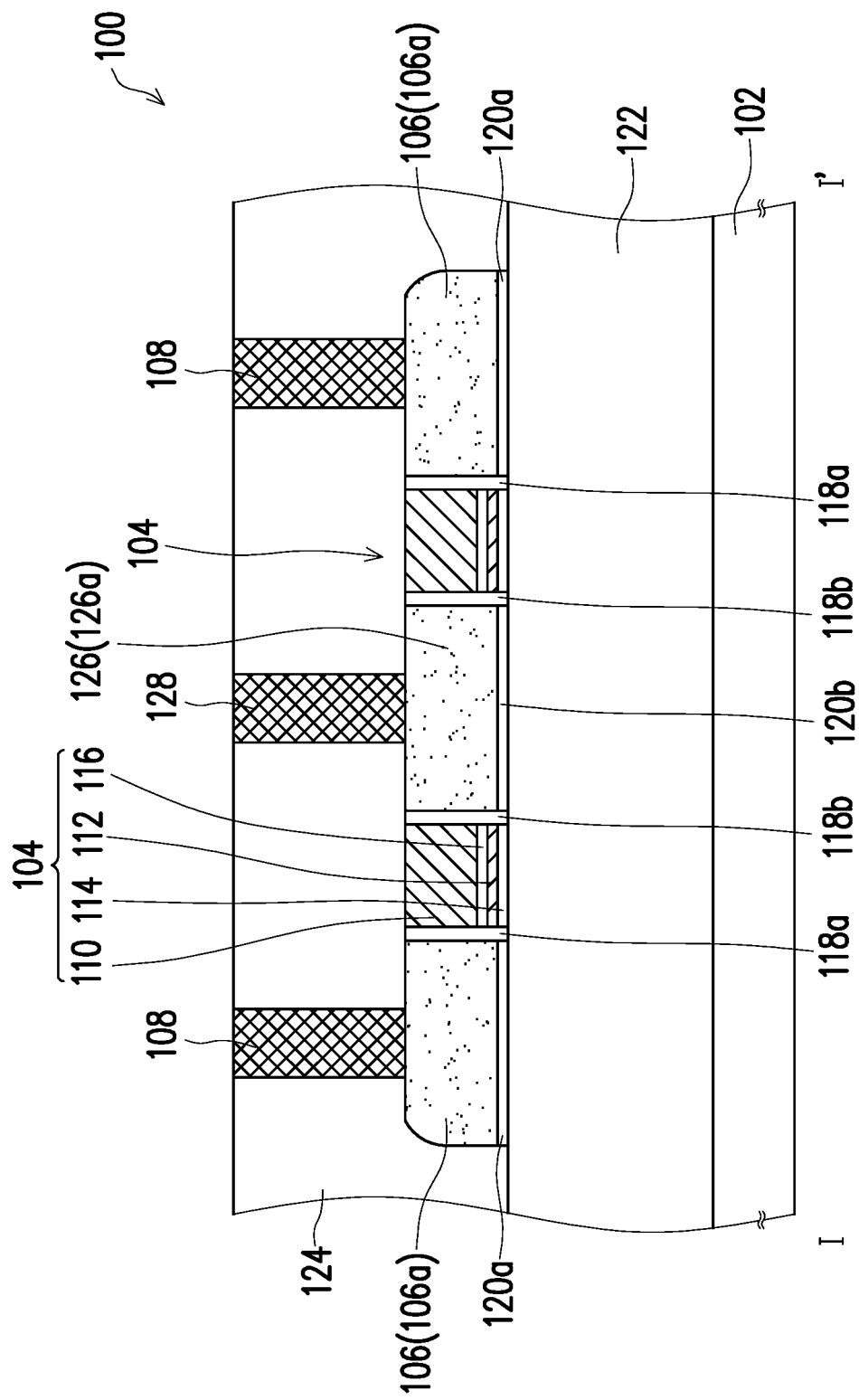
FIG. 2A is a cross-sectional view taken along a sectional line I-I' depicted in FIG. 1.
Figure 2B:
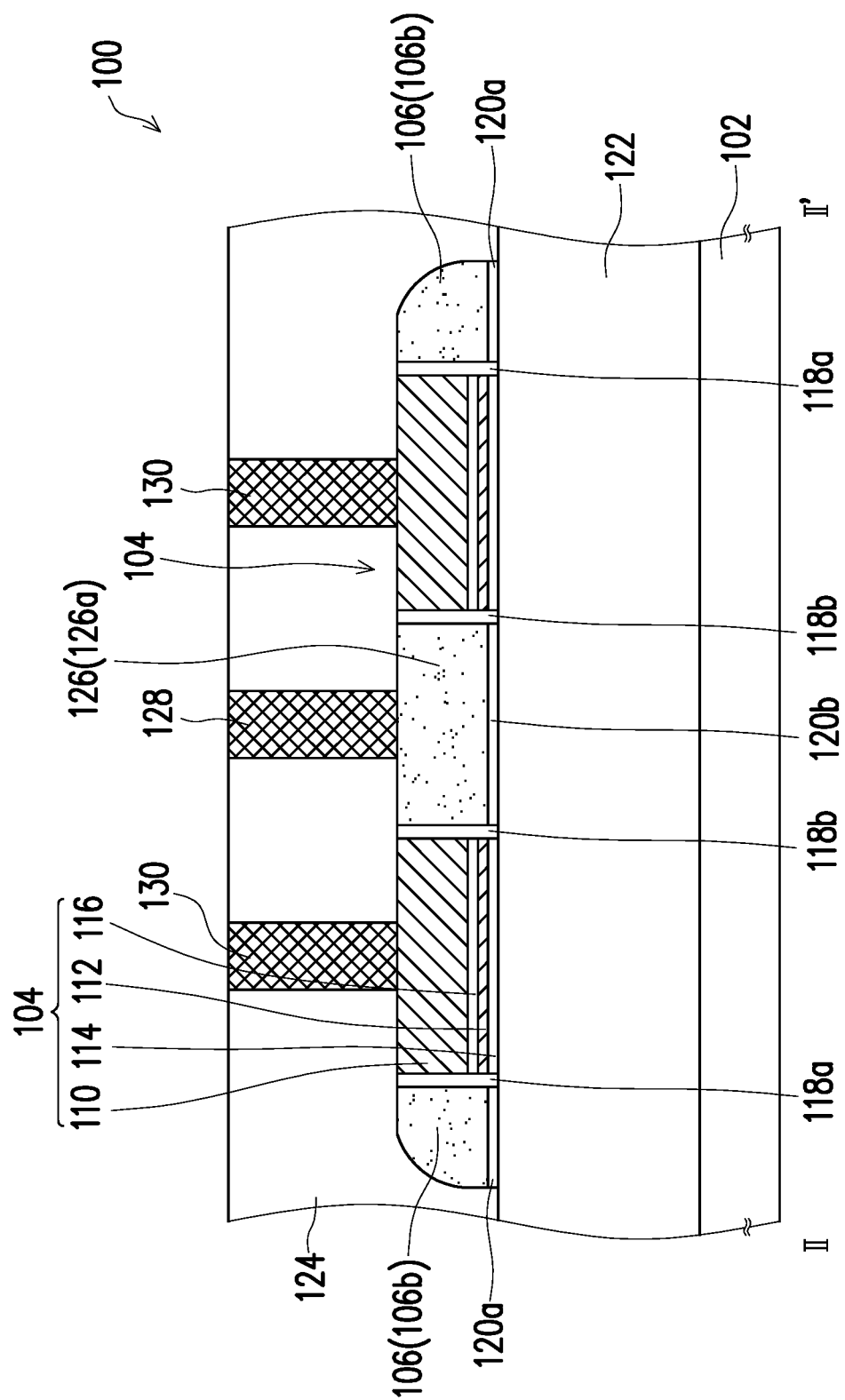
FIG. 2B is a cross-sectional view taken along a sectional line II-II' depicted in FIG. 1.

FIG. 1 is a top view of a memory structure according to an embodiment of the invention. FIG. 2A is a cross-sectional view taken along a sectional line I-I' depicted in FIG. 1. FIG. 2B is a cross-sectional view taken along a sectional line II-II' depicted in FIG. 1. In the top view of FIG. 1, some of the components in FIG. 2A and FIG. 2B are omitted to clearly illustrate the relationship between the components of FIG. 1.

Referring to FIG. 1, FIG. 2A, and FIG. 2B, a memory structure 100 includes a substrate 102, at least one stacked gate structure 104, a spacer conductive layer 106, and a contact 108. The memory structure 100 is, for example, a non-volatile memory structure, but the invention is not limited thereto. The substrate 102 is, for example, a semiconductor substrate such as a silicon substrate.

The stacked gate structure 104 is disposed on the substrate 102 and includes a control gate 110. When the number of stacked gate structures 104 is multiple, each of the stacked gate structures 104 may include the control gate 110. The control gate 110 extends in the first direction D1. The first direction D1 intersects the second direction D2. The material of the control gate 110 is, for example, a conductive material such as doped polysilicon.

Furthermore, the stacked gate structure 104 may further include at least one of a charge storage layer 112, a dielectric layer 114, and a dielectric layer 116. The charge storage layer 112 is located between the substrate 102 and the control gate 110 and is electrically insulated from the substrate 102 and the control gate 110. The charge storage layer 112 is, for example, a charge trapping layer or a floating gate. The material of the charge trapping layer is, for example, silicon nitride. The material of the floating gate is, for example, doped polysilicon. The dielectric layer 114 is located between the charge storage layer 112 and the substrate 102, whereby the charge storage layer 112 may be electrically insulated from the substrate 102. The material of the dielectric layer 114 is, for example, silicon oxide. The dielectric layer 116 is located between the control gate 110 and the charge storage layer 112, whereby the charge storage layer 112 may be electrically insulated from the control gate 110. The material of the dielectric layer 116 is, for example, silicon oxide.

The spacer conductive layer 106 is located on one sidewall of the control gate 110 and is electrically insulated from the control gate 110. The material of the spacer conductive layer 106 is, for example, a conductive material such as doped polysilicon. Moreover, the memory structure 100 may further include at least one of a spacer dielectric layer 118a and a dielectric layer 120a. The spacer dielectric layer 118a is located between the spacer conductive layer 106 and the stacked gate structure 104, whereby the spacer conductive layer 106 is electrically insulated from the control gate 110. The spacer dielectric layer 118a may be a single-layer structure or a multilayer structure. The material of the spacer dielectric layer 118a is, for example, silicon oxide, silicon nitride or a combination thereof. The dielectric layer 120a is located between the spacer conductive layer 106 and the substrate 102. The material of the dielectric layer 120a is, for example, silicon oxide.

In the present embodiment, the definitions of "merged spacer portion" and "non-merged spacer portion" are as follows. In the process of forming the spacer conductive layer, a spacer conductive material layer covering the stacked gate structure 104 is formed first, then an etching back process is performed on the spacer conductive material layer, and the spacer conductive layer is formed on the sidewall of the stacked gate structure 104. In the gap filling process of the spacer conductive material layer, if the width of the trench (or notch) is twice or less than twice the thickness of the spacer conductive material layer, the adjacent portions of the spacer conductive material layer on the sidewall of the trench (or notch) will be merged together to form a "merged portion". In the spacer conductive layer, the portion formed by the above-mentioned "merged portion" is defined as "merged spacer portion". Furthermore, the portion not formed by the above-mentioned "merged portion" is defined as "non-merged spacer portion". As a result, since the merged spacer portion has a large line width, the process of connecting the contact to the merged spacer portion can have a larger process window.

Referring to FIG. 1, the spacer conductive layer 106 includes a merged spacer portion 106a and a non-merged spacer portion 106b. The line width W1 of the merged spacer portion 106a is greater than the line width W2 of the non-merged spacer portion 106b. In the present embodiment, the line width W1 of the merged spacer portion 106a is the width in the first direction D1, and the line width W2 of the non-merged spacer portion 106b is the width in the second direction D2. The line width W1 of the merged spacer portion 106a is, for example, 1.2 to 2 times the line width W2 of the non-merged spacer portion 106b.

The substrate 102 may include a contact landing region R. The control gate 110 located in the contact landing region R has a notch 110a. The merged spacer portion 106a is located in the notch 110a. The line width W3 of the control gate 110 in the contact landing region R may be greater than the line width W4 of the control gate 110 outside the contact landing region R. In the present embodiment, the line width W3 and line width W4 of the control gate 110 are the widths in the second direction D2. Moreover, the memory structure 100 may further include active regions AA. The active regions AA extend in the second direction D2. The contact landing region R may be located between two adjacent active regions AA.

Referring to FIG. 1 and FIG. 2A, the memory structure 100 may further include an isolation structure 122. The isolation structure 122 is located in the substrate 102. The merged spacer portion 106a may be located above the isolation structure 122. Additionally, the dielectric layer 120a may be located between the spacer conductive layer 106 and the isolation structure 122. The isolation structure 122 is, for example, a shallow trench isolation (STI) structure. The material of the isolation structure 122 is, for example, silicon oxide.

The contact 108 is connected to the merged spacer portion 106a. Since the merged spacer portion 106a has a large line width, the process of connecting the contact 108 to the merged spacer portion 106a can have a larger process window. The material of contact 108 is, for example, a metal material such as tungsten, copper or aluminum. Furthermore, the memory structure 100 may further include a dielectric layer 124. The contact 108 may be located in the dielectric layer 124.

Referring to FIG. 1, FIG. 2A, and FIG. 2B, the memory structure 100 may further include a spacer conductive layer 126. The spacer conductive layer 126 is located on the other sidewall of control gate 110 and is electrically insulated from control gate 110. The spacer conductive layer 126 and the spacer conductive layer 106 are not connected to each other. The material of the spacer conductive layer 126 is, for example, a conductive material such as doped polysilicon. In addition, the memory structure 100 may further include at least one of a spacer dielectric layer 118b and a dielectric layer 120b. The spacer dielectric layer 118b is located between the spacer conductive layer 126 and the stacked gate structure 104, whereby the spacer conductive layer 126 is electrically insulated from the control gate 110. The spacer dielectric layer 118b may be a single-layer structure or a multilayer structure. The material of the spacer dielectric layer 118b is, for example, silicon oxide, silicon nitride or a combination thereof. The dielectric layer 120b is located between the spacer conductive layer 126 and the substrate 102. In the present embodiment, the dielectric layer 120b may be located between the spacer conductive layer 126 and the isolation structure 122. The material of the dielectric layer 120b is, for example, silicon oxide. The spacer conductive layer 126 may include a merged spacer portion 126a and a non-merged spacer portion 126b. The merged spacer portion 126a may be located above the isolation structure 122. The line width W5 of the merged spacer portion 126a is greater than the line width W6 of the non-merged spacer portion 126b. In the present embodiment, the line width W5 of the merged spacer portion 126a and the line width W6 of the non-merged spacer portion 126b are the widths in the second direction D2. The line width W5 of the merged spacer portion 126a is, for example, 1.2 to 2 times the line width W6 of the non-merged spacer portion 126b.

Referring to FIG. 1, two adjacent spacer conductive layers 126 are disposed between two adjacent control gates 110. The two adjacent spacer conductive layers 126 may share the merged spacer portion 126a. The spacing S1 between the two adjacent control gates 110 may be less than the spacing S2 between the two adjacent control gates 110. In the contact landing region R, the trench T located between the two adjacent control gates 110 may have the spacing S1. The merged spacer portion 126a may be located in the trench T having spacing S1 between the two adjacent control gates 110.

Referring to FIG. 1, FIG. 2A, and FIG. 2B, the memory structure 100 may further include at least one of a contact 128 and a contact 130. The contact 128 is connected to the merged spacer portion 126a. Since the merged spacer portion 126a has a large line width, the process of connecting the contact 128 to the merged spacer portion 126a can have a larger process window. The contact 130 is connected to control gate 110. Additionally, the contact 128 and the contact 130 may be located in the dielectric layer 124.

Based on the above, in the memory structure 100, whether connecting contact 108 to merged spacer portion 106a having a larger line width, or connecting contact 128 to a merged spacer portion 126a having a larger line width, it helps to improve the process window of contact.

In the above embodiment, the memory structure 100 is exemplified by having the merged spacer portion 106a and the merged spacer portion 126a which are located at both sides of the control gate 110, but the invention is not limited thereto. As long as the memory structure 100 has at least one of the merged spacer portion 106a and the merged spacer portion 126a, it belongs to the protection scope of the invention. In addition, the memory structure 100 may further include other components known to those skilled in the art, such as a doped region (not shown) in the active region AA, a contact (not shown) connected to the doped region, or a metal silicide (not shown) located on the control gate 110, and it will not be described herein.

Figure 3:
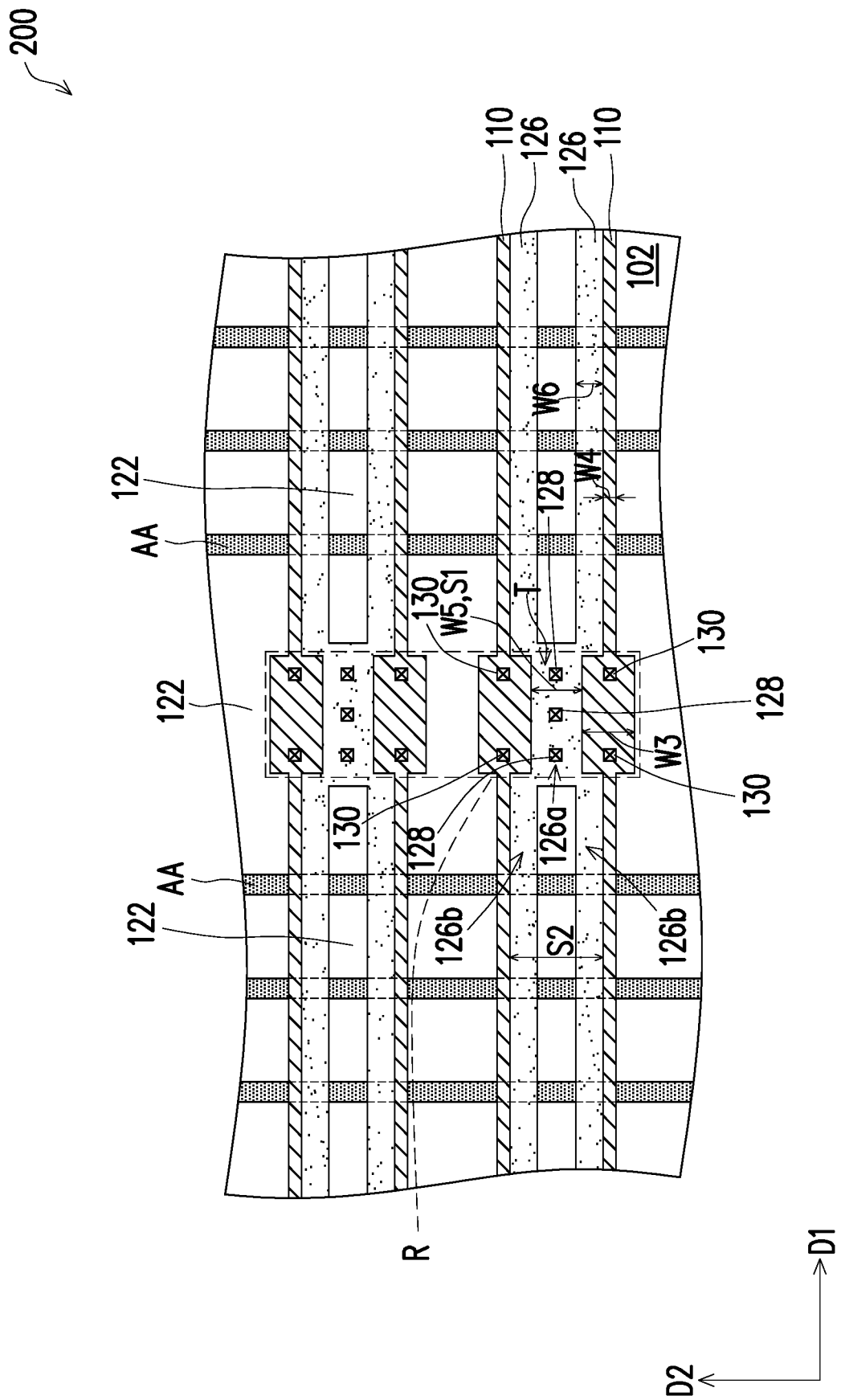
FIG. 3 to FIG. 5 are top views of the memory structure according to other embodiments of the invention.
Figure 4:
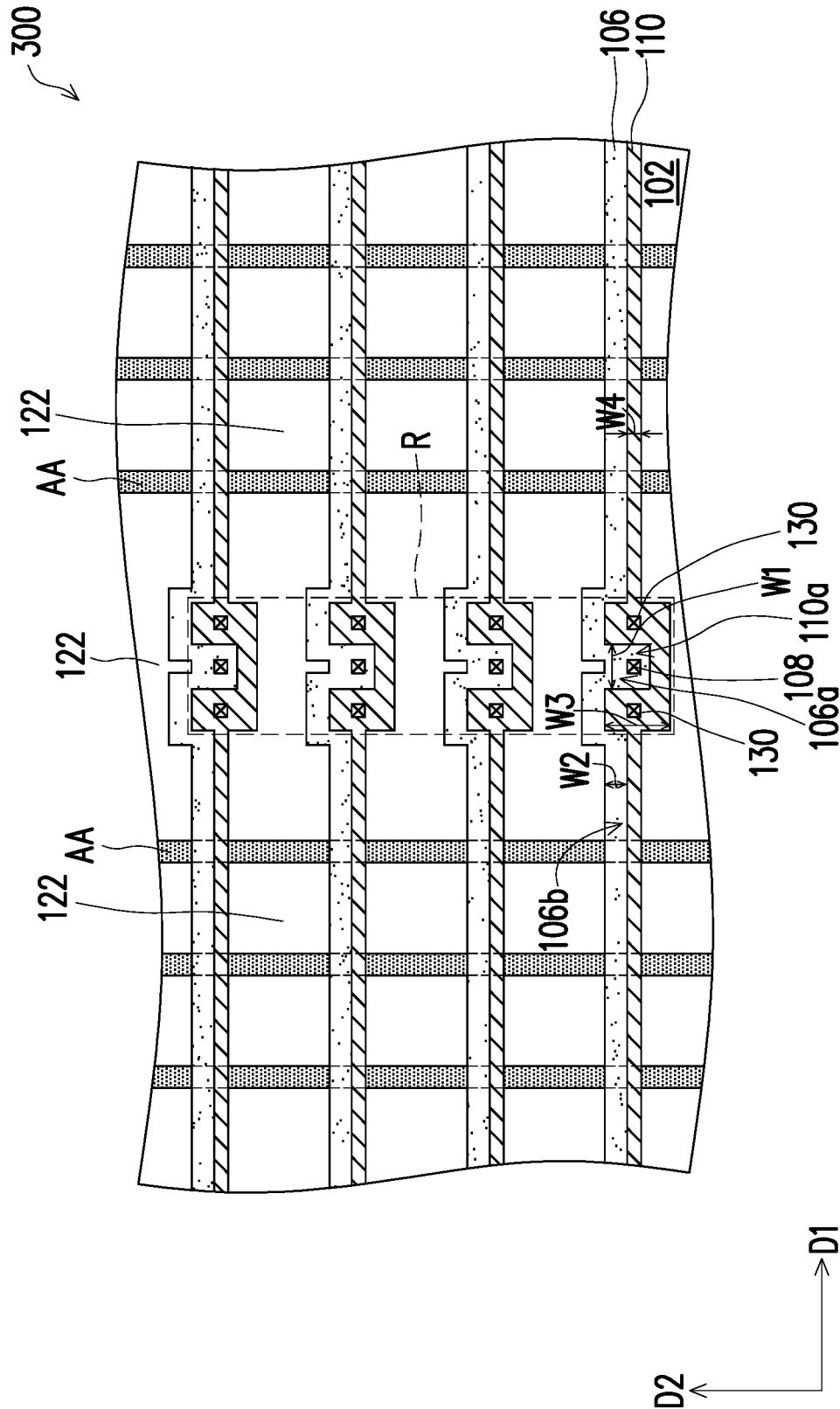
Figure 5:
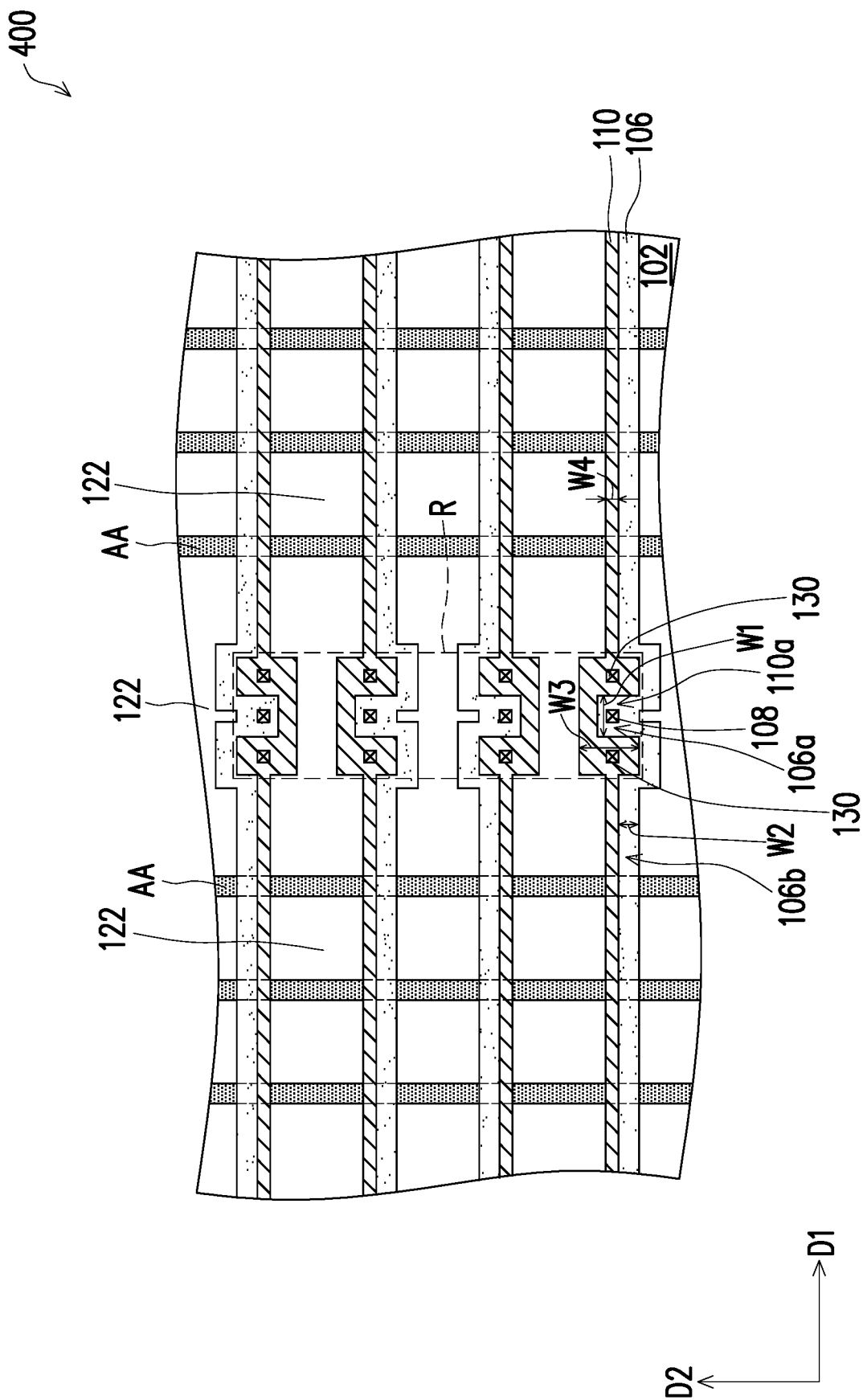

FIG. 3 to FIG. 5 are top views of the memory structure according to other embodiments of the invention.

Referring to FIG. 1 and FIG. 3 to FIG. 5, the difference between the embodiment of FIG. 1 and the embodiments of FIG. 3 to FIG. 5 is as follows. The memory structure 100 of FIG. 1 has two spacer conductive layers located on two sidewalls of the control gate 110. Each of the memory structure 200 of FIG. 3, the memory structure 300 of FIG. 4, and the memory structure 400 of FIG. 5 has one spacer conductive layer located on one sidewall of the control gate 110 and has no spacer conductive layer located on the other sidewall of the control gate 110.

Referring to FIG. 3, the memory structure 200 has the spacer conductive layer 126 only located on one sidewall of the control gate 110 and has no spacer conductive layer located on the other sidewall of the control gate 110. In addition, the control gate 110 in the memory structure 200 may not have the notch 110a in FIG. 1, thereby further increasing the integration of the memory structure 200, but the invention is not limited thereto. In another embodiment, the control gate 110 in the memory structure 200 may have the notch 110a in FIG. 1.

Referring to FIG. 4 and FIG. 5, the memory structure 300 and the memory structure 400 have the spacer conductive layer 106 only located on one sidewall of the control gate 110 and have no spacer conductive layer located on the other sidewall of the control gate 110. In the memory structure 300 of FIG. 4, the notches 110a of the control gates 110 are exemplified by facing in the same direction, but the invention is not limited thereto. In the memory structure 400 of FIG. 5, the notches 110a of the two adjacent control gates 110 may face in different directions.

Furthermore, regarding the similar components in the embodiment of FIG. 1 and the embodiments of FIG. 3 to FIG. 5, reference may be made to the description of the embodiment of FIG. 1, and the description thereof is not repeated herein.

Based on the above, in the memory structure 200, the memory structure 300, and the memory structure 400, the contact 108 is connected to the merged spacer portion 106a having a larger line width, or the contact 128 is connected to the merged spacer portion 126a having a larger line width. Therefore, the process window of contact can be effectively improved.

In summary, in the memory structure of the aforementioned embodiments, since the contact is connected to the merged spacer portion having a larger line width, the memory structure can have a larger process window of contact.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A memory structure, comprising:
   a substrate;
   at least one stacked gate structure located on the substrate and comprising a control gate, wherein the control gate extends in a first direction;
   a first spacer conductive layer located on one sidewall of the control gate and electrically insulated from the control gate, wherein the first spacer conductive layer comprises a first merged spacer portion and a first non-merged spacer portion, and a line width of the first merged spacer portion is greater than a line width of the first non-merged spacer portion; and
   a first contact connected to the first merged spacer portion.

2. The memory structure according to claim 1, wherein the line width of the first merged spacer portion is 1.2 to 2 times the line width of the first non-merged spacer portion.

3. The memory structure according to claim 1, wherein the substrate comprises a contact landing region.

4. The memory structure according to claim 3, wherein the control gate located in the contact landing region has a notch, and the first merged spacer portion is located in the notch.

5. The memory structure according to claim 3, wherein a line width of the control gate in the contact landing region is greater than a line width of the control gate outside the contact landing region.

6. The memory structure according to claim 3, further comprising:
   active regions extending in a second direction, wherein the first direction intersects the second direction, and the contact landing region is located between two adjacent active regions.

7. The memory structure according to claim 1, wherein when the number of the at least one stacked gate structure is multiple, each of the stacked gate structures comprises the control gate, two adjacent first spacer conductive layers are disposed between two adjacent control gates, and the two adjacent first spacer conductive layers share the first merged spacer portion.

8. The memory structure according to claim 7, wherein a first spacing between the two adjacent control gates is less than a second spacing between the two adjacent control gates, and the first merged spacer portion is located in a trench having the first spacing between the two adjacent control gates.

9. The memory structure according to claim 1, further comprising:
   an isolation structure located in the substrate.

10. The memory structure according to claim 9, wherein the first merged spacer portion is located above the isolation structure.

11. The memory structure according to claim 1, further comprising:
    a second spacer conductive layer located on the other sidewall of the control gate and electrically insulated from the control gate.

12. The memory structure according to claim 11, wherein the second spacer conductive layer comprises a second merged spacer portion and a second non-merged spacer portion, and a line width of the second merged spacer portion is greater than a line width of the second non-merged spacer portion.

13. The memory structure according to claim 12, wherein the line width of the second merged spacer portion is 1.2 to 2 times the line width of the second non-merged spacer portion.

14. The memory structure according to claim 12, wherein when the number of the at least one stacked gate structure is multiple, each of the stacked gate structures comprises the control gate.

15. The memory structure according to claim 14, wherein two adjacent second spacer conductive layers are disposed between two adjacent control gates.

16. The memory structure according to claim 15, wherein the two adjacent second spacer conductive layers share the second merged spacer portion.

17. The memory structure according to claim 14, a first spacing between two adjacent control gates is less than a second spacing between the two adjacent control gates, and the second merged spacer portion is located in a trench having the first spacing between the two adjacent control gates.

18. The memory structure according to claim 12, further comprising:
    a second contact connected to the second merged spacer portion.

19. The memory structure according to claim 1, wherein the at least one stacked gate structure further comprises:
    a charge storage layer located between the substrate and the control gate and electrically insulated from the substrate and the control gate.

20. The memory structure according to claim 19, wherein the charge storage layer comprises a charge trapping layer or a floating gate.

* * * * *